(12) United States Patent
Hisamatsu et al.

(10) Patent No.: US 11,264,236 B2
(45) Date of Patent: Mar. 1, 2022

(54) SUBSTRATE PROCESSING METHOD (71) Applicant: TOKYO ELECTRON LIMITED, Tokyo (JP)

(72) Inventors: Toru Hisamatsu, Miyagi (JP); Takayuki Katsunuma, Miyagi (JP); Shinya Ishikawa, Miyagi (JP); Yoshihide Kihara, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/714,218

(22) Filed: Dec. 13, 2019

(65) Prior Publication Data
US 2020/0194257 A1 Jun. 18, 2020

(30) Foreign Application Priority Data

Dec. 14, 2018 (JP) .............................. JP2018-234699

(51) Int. Cl.
*H01L 21/02* (2006.01)
(52) U.S. Cl.
CPC .. *H01L 21/02332* (2013.01); *H01L 21/02096* (2013.01); *H01L 21/02164* (2013.01); *H01L 21/02274* (2013.01)

(58) Field of Classification Search
CPC combination set(s) only.
See application file for complete search history.

(56) References Cited

U.S. PATENT DOCUMENTS

| | | | |
|---|---|---|---|
| 6,767,834 B2* | 7/2004 | Chung et al. | ..... H01L 21/76897 257/774 |
| 2006/0286795 A1* | 12/2006 | Yosho | ............... H01L 21/76811 438/637 |
| 2009/0020884 A1* | 1/2009 | Lee | .................... H01L 21/76897 257/774 |
| 2016/0351418 A1* | 12/2016 | Hsu | ...................... H01L 21/0206 |
| 2018/0090345 A1* | 3/2018 | Kouzuma | ......... H01L 21/67115 |

FOREIGN PATENT DOCUMENTS

JP 2010-165954 A 7/2010

* cited by examiner

*Primary Examiner* — Zandra V Smith
*Assistant Examiner* — Andre C Stevenson
(74) *Attorney, Agent, or Firm* — Weihrouch IP

(57) ABSTRACT

A substrate processing method includes: providing a substrate having a pattern formed on a surface layer thereof; setting a temperature of the substrate such that a change in the pattern becomes a predetermined change amount; forming a reaction layer having a thickness corresponding to the temperature set in the setting on the surface layer of the substrate; and applying energy to the substrate formed with the reaction layer thereby removing the reaction layer from the surface layer of the substrate.

11 Claims, 10 Drawing Sheets

SUBSTRATE PROCESSING METHOD

CROSS-REFERENCE TO RELATED APPLICATIONS

This application is based on and claims priority from Japanese Patent Application No. 2018-234699, filed on Dec. 14, 2018 with the Japan Patent Office, the disclosure of which is incorporated herein in its entirety by reference.

TECHNICAL FIELD

The present disclosure relates to a substrate processing method.

BACKGROUND

Japanese Patent Laid-Open Publication No. 2010-165954 discloses a technique for removing (etching) a native oxide film on a wafer having a reaction layer formed thereon by causing the native oxide film on the wafer to react with a processing gas and then heating the wafer to sublimate the reaction layer.

SUMMARY

A substrate processing method according to an aspect of the present disclosure includes: providing a substrate having a pattern formed on a surface layer thereof; setting a temperature of the substrate such that a change in the pattern becomes a predetermined change amount; forming a reaction layer having a thickness corresponding to the temperature set in the setting on the surface layer of the substrate; and applying energy to the substrate thereby removing the reaction layer from the surface layer of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

[Configuration of Apparatus]

An exemplary apparatus used for a substrate processing according to the present embodiment will be described. Hereinafter, a case where a substrate is processed according to the present embodiment using a plasma processing apparatus and a heating apparatus will be described as an example.

Figure 1:
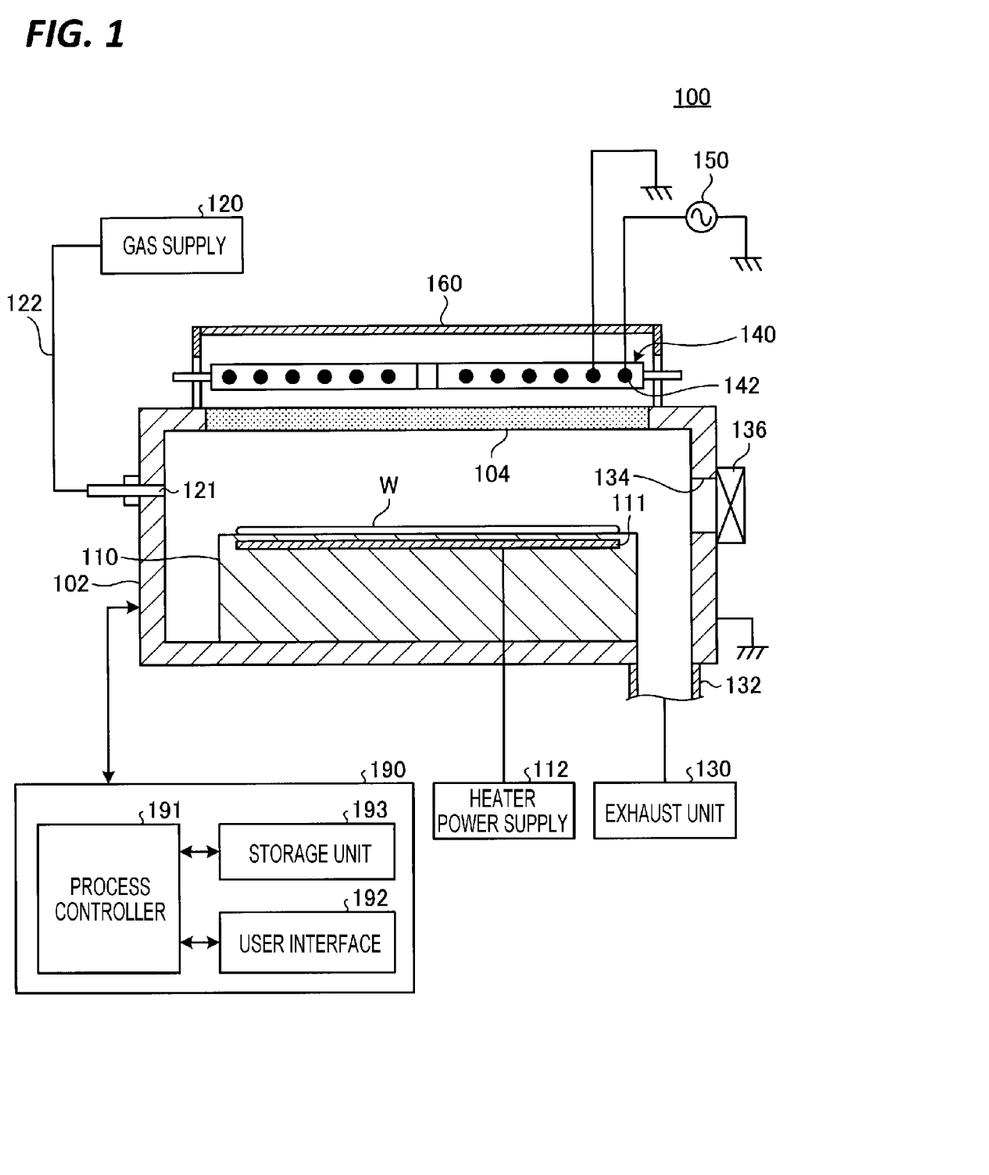
FIG. 1 is a view illustrating an exemplary schematic configuration of a plasma processing apparatus according to an embodiment.

First, an exemplary configuration of a plasma processing apparatus according to the present embodiment will be described. FIG. 1 is a view illustrating an exemplary schematic configuration of a plasma processing apparatus according to an embodiment. In the present embodiment, a case where a plasma processing apparatus 100 is an inductively coupled plasma (ICP) type plasma processing apparatus will be described as an example.

The plasma processing apparatus 100 includes a tubular processing chamber 102 made of a metal (e.g., aluminum). On the bottom of the processing chamber 102, a stage 110 is provided so as to place a semiconductor wafer (hereinafter, referred to as a "wafer") W thereon. The stage 110 is formed in a cylindrical shape using, for example, aluminum. The stage 110 is provided with a heater 111. The heater 111 is connected to a heater power supply 112, and generates heat by power supplied from the heater power supply 112. The stage 110 controls the temperature of the wafer W by the heater 111. Although not illustrated, the stage 110 may be provided with necessary functions such as, for example, an electrostatic chuck for attracting and holding the wafer W by an electrostatic force and a temperature adjustment mechanism such as, for example, a coolant flow path. When the plasma processing apparatus 100 is used as an etching apparatus, a high-frequency bias for drawing ions into the wafer W is applied to the stage 110.

A plate-shaped dielectric body 104 made of, for example, quartz glass or ceramic is provided on the ceiling of the processing chamber 102 to face the stage 110. Specifically, the dielectric body 104 is formed, for example, in a disk shape, and is hermetically attached so as to close an opening formed in the ceiling of the processing chamber 102.

A gas supply 120 is connected to the processing chamber 102 to supply various gases used for processing the wafer W.

A gas inlet 121 is formed in the side wall of the processing chamber 102. The gas supply 120 is connected to the gas inlet 121 through a gas supply pipe 122.

The gas supply 120 is connected to gas supply sources of various gases used for processing the wafer W through respective gas supply lines. Each gas supply line branches appropriately to correspond to a substrate processing process, and is provided with an opening/closing valve and a flow rate controller. The gas supply 120 is configured to control the flow rates of various gases by controlling the opening/closing valve and the flow rate controller provided in each gas supply line. The gas supply 120 supplies various gases to the gas inlet 121 depending on the substrate processing process. The various gases supplied to the gas inlet 121 are supplied into the processing chamber 102 from the gas inlet 121. In addition, although FIG. 1 illustrates the case where the gas supply 120 is configured to supply a gas from the side wall of the processing chamber 102 as an example, the present disclosure is not necessarily limited thereto. For example, the gas may be supplied from the ceiling of the processing chamber 102. In this case, for example, a gas inlet may be formed in the central portion of the dielectric body 104 such that the gas may be supplied from the central portion of the dielectric body 104.

An exhaust unit 130 configured to exhaust the atmosphere in the processing chamber 102 is connected to the bottom of the processing chamber 102 through an exhaust pipe 132. The exhaust unit 130 is constituted with, for example, a vacuum pump, and is configured to reduce the pressure in the processing chamber 102 to a predetermined pressure. A wafer loading/unloading port 134 is formed in the side wall of the processing chamber 102. The wafer loading/unloading port 134 is provided with a gate valve 136. For example, when a wafer W is loaded, the gate valve 136 is opened, the wafer W is placed on the stage 110 in the processing chamber 102 by a transport mechanism such as, for example, a transport arm (not illustrated), and the gate valve 136 is closed so as to process the wafer.

A planar high-frequency antenna 140 and a shield member 160 covering the high-frequency antenna 140 are provided on the upper surface (outer surface) of the dielectric body 104 in the ceiling of the processing chamber 102. The high-frequency antenna 140 is provided with an antenna element 142. The antenna element is formed in a spiral coil shape using a conductor such as, for example, copper, aluminum, or stainless steel. A high-frequency power supply 150 is connected to the antenna element 142. The high-frequency power supply 150 supplies high-frequency waves of a predetermined frequency (e.g., 40 MHz) to the antenna element 142, which generates plasma, at predetermined power. In addition, the high-frequency waves output from the high-frequency power supply are not limited to the frequency described above. For example, high-frequency waves of various frequencies such as, for example, 13.56 MHz, 27 MHz, 40 MHz, and 60 MHz may be supplied.

When high-frequency waves are supplied to the antenna element 142 from the high-frequency power supply 150, an induction magnetic field is formed in the processing chamber 102. The formed induction magnetic field excites the processing gas introduced into the processing chamber 102 to generate plasma on the wafer W. The high-frequency antenna 140 may be provided with a plurality of antenna elements 142, and high-frequency waves of the same frequency or different frequencies may be applied to the antenna elements 142 from the high-frequency power supply 150. For example, in the plasma processing apparatus 100, the high-frequency antenna 140 may be divided into a central portion and a peripheral portion of the dielectric antenna 104, the antenna elements 142 may be provided in the central portion and the peripheral portion of the dielectric body 104, respectively, and plasma may be controlled in each of the central portion and the peripheral portion of the dielectric body 104. In the plasma processing apparatus 100, in addition to the high-frequency antenna 140 provided on the ceiling of the processing chamber 102, high-frequency power may be supplied to a lower electrode constituting the stage 110 so as to generate plasma.

The plasma processing apparatus 100 may perform a plasma processing such as, for example, etching and film formation, on a wafer W by the generated plasma.

The operation of the plasma processing apparatus 100 configured as described is totally controlled by a controller 190. The controller 190 includes a process controller 191 that includes a CPU and controls each unit of the plasma processing apparatus 100, a user interface 192, and a storage unit 193.

The process controller 191 controls various operations of the plasma processing apparatus 100. For example, the process controller 191 controls the operation of supplying various gases from the gas supply 120. The process controller 191 also controls the frequency and power of high-frequency waves supplied from the high-frequency power supply 150 to the antenna element 142. In addition, the process controller 191 controls the power supplied from the heater power supply 112 to the heater 111 to control the calorific value of the heater 111, thereby controlling the temperature of the wafer W.

The user interface 192 includes, for example, a keyboard configured to allow an operator to input commands for managing the plasma processing apparatus 100 therethrough, and a display configured to visualize and display the operation situation of the plasma processing apparatus 100.

The storage unit 193 stores, for example, a control program (software) for implementing various processings executed in the plasma processing apparatus 100 under the control of the process controller 191, and recipes storing, for example, processing condition data. Then, as required, an arbitrary recipe is called from the storage unit 193 using, for example, a command from the user interface 192 and is executed in the process controller 191, so that a desired processing in the plasma processing apparatus 100 is performed under the control of the process controller 191. In addition, the control program and the recipes of, for example, the processing condition data may be used in the state of being stored in a computer-readable storage medium, or may be used online by causing the control program and the recipes to be transmitted from another device via, for example, a dedicated line at any time. The computer-readable storage medium may be, for example, a hard disk, a compact disk, a flexible disk, or semiconductor memory.

Figure 2:
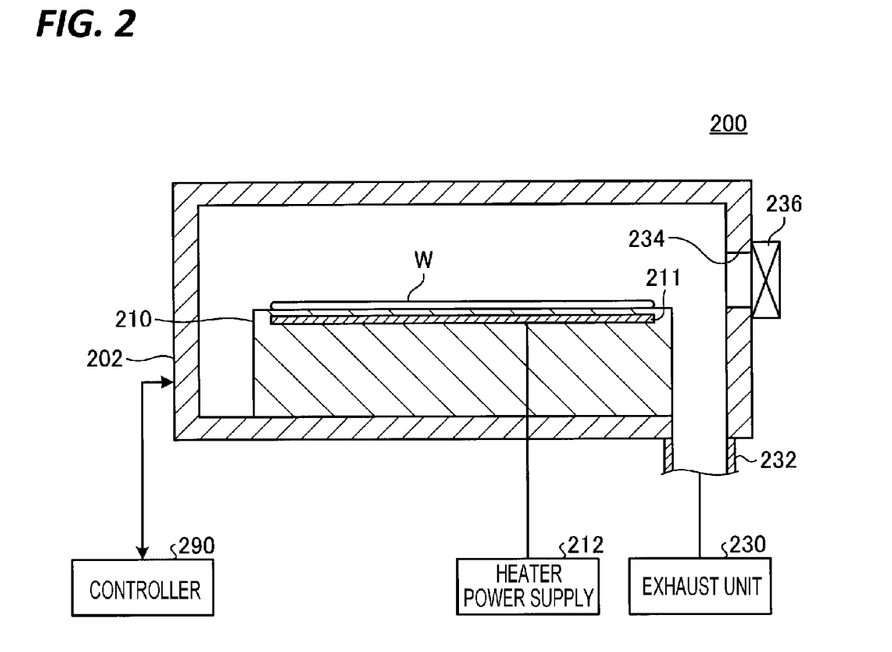
FIG. 2 is a view illustrating an exemplary schematic configuration of a heating apparatus according to an embodiment.

Next, an exemplary configuration of a heating apparatus according to the present embodiment will be described. FIG. 2 is a view illustrating an exemplary schematic configuration of a heating apparatus according to an embodiment. In the present embodiment, a heating apparatus 200 is provided separately from the plasma processing apparatus 100 illustrated in FIG. 1, and a wafer W is transported to the heating apparatus 200 and the plasma processing apparatus 100 by a transport mechanism such as, for example, a transport arm (not illustrated).

The heating apparatus 200 includes a tubular processing chamber 202 made of a metal (e.g., aluminum).

On the bottom portion of the processing chamber 202, a stage 210 is provided to place a wafer W thereon. The stage 210 is formed in a cylindrical shape using, for example, aluminum. The stage 210 is provided with a heater 211. The heater 211 is connected to a heater power supply 212, and generates heat by power supplied from the heater power supply 212. The stage 210 controls the temperature of the wafer W by the heater 211. Although not illustrated, the stage 210 may be provided with various functions such as, for example, an electrostatic chuck configured to attract and hold a wafer W by electrostatic force, as needed.

An exhaust unit 230 configured to exhaust the atmosphere in the processing chamber 202 is connected to the bottom of the processing chamber 202 through an exhaust pipe 232. The exhauster 230 is constituted with, for example, a vacuum pump, and is configured to reduce the pressure in the processing chamber 202 to a predetermined pressure. A wafer loading/unloading port 234 is formed in the side wall of the processing chamber 202. The wafer loading/unloading port 234 is provided with a gate valve 236. For example, when a wafer W is loaded, the gate valve 236 is opened, the wafer W is placed on the stage 210 in the processing chamber 202 by a transport mechanism such as, for example, a transport arm (not illustrated), and the gate valve 236 is closed so as to process the wafer.

The heating apparatus 200 performs a heating processing for heating the wafer W placed on the stage 210 by the heater 211.

The operation of the heating apparatus 200 configured as described is totally controlled by a controller 290. The controller 290 is, for example, a computer, and includes, for example, a central processing unit (CPU), random access memory (RAM), read only memory (ROM), and an auxiliary storage device. The CPU operates on the basis of a program stored in the ROM or the auxiliary storage device or a process condition of a plasma processing so as to control the operations of the entire apparatus. In addition, the controller 290 may be provided inside or outside the heating apparatus 200. In the case where the controller 290 is provided outside the heating apparatus 200, the controller 290 is capable of controlling the heating apparatus 200 through, for example, a wired or wireless communication mechanism.

Next, a substrate processing method according to the present embodiment will be described.

In the manufacture of a semiconductor device, a mask having a pattern formed therein is provided on a wafer W, and the wafer W is etched. A shape corresponding to the pattern is formed on the wafer W. For this reason, it is expected to control the shape of the pattern with high accuracy.

Accordingly, in the substrate processing according to an embodiment, the temperature of the wafer W is set such that a change in the pattern becomes a predetermined change amount. In the substrate processing, a chemical removal (CR) processing is performed on the wafer W. The CR processing includes forming a reaction layer having a thickness corresponding to a set temperature on the surface layer of the wafer W, and applying energy to the wafer W on which the reaction layer is formed so as to remove the reaction layer. Thus, the substrate processing according to an embodiment is capable of controlling the shape of a pattern with high accuracy.

Figure 3:
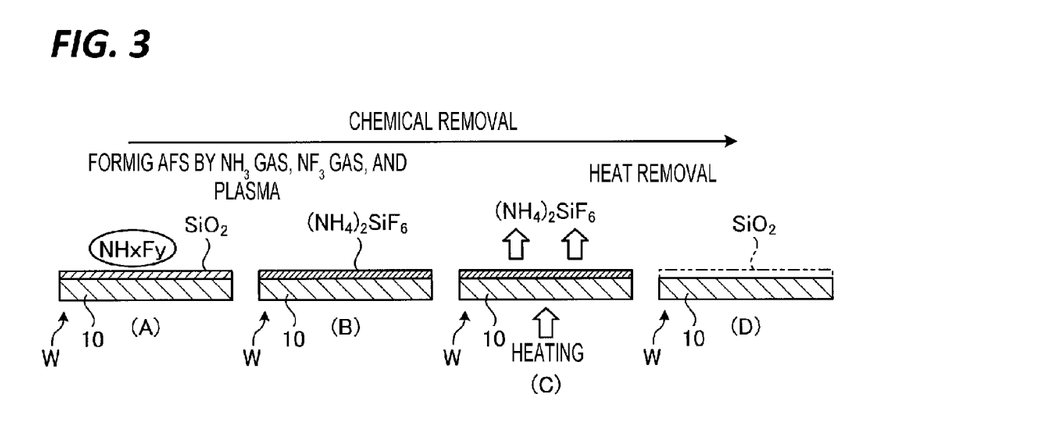
FIG. 3 is a view for describing an exemplary flow of a CR processing according to an embodiment.

A CR processing will be described. FIG. 3 is a view for describing an exemplary flow of a CR processing according to an embodiment. The wafer W illustrate in (A) of FIG. 3 is provided with an $SiO_2$ film on a Si layer 10 serving as a base.

First, a reaction layer is formed by plasma on the surface layer of the wafer W on which the $SiO_2$ film is provided. For example, the plasma processing apparatus 100 introduces various gases such as, for example, $NF_3$ gas, $NH_3$ gas, or Ar gas from the gas supply 120 so as to generate plasma. As a result, as illustrated in (A) of FIG. 3, $NH_xF_y$ is generated. For example, by the following reaction, $NH_xF_y$ such as, for example, $NH_4F$, or $NH_4 \cdot HF$, is generated.

$NF_3 + NH_3 \rightarrow NH_xF_y$ (e.g., $NH_4F + NH_4 \cdot HF$)

The generated $NH_xF_y$ reacts with the $SiO_2$ film as follows, and, as illustrated in (B) of FIG. 3, $(NH_4)_2SiF_6$ (ammonium fluorosilicate) is formed as a reaction layer. Hereinafter, $(NH_4)_2SiF_6$ is also referred to as "AFS." In the CR processing, AFS may be formed only by gas supply. For example, the AFS may be formed by supplying HF gas and $NH_3$ gas. When the AFS is formed using plasma, reaction speed is improved. Meanwhile, when the film is formed without using plasma, the film may be formed without damage.

$NH_xF_y + SiO_2 \rightarrow (NH_4)_2SiF_6 + H_2O \uparrow$

The AFS sublimates when the temperature rises above 100° C. Therefore, when forming the reaction layer, the wafer W is controlled to a predetermined temperature of 100° C. or lower. For example, the plasma processing apparatus 100 controls the wafer W to a predetermined temperature of 100° C. or lower by controlling, for example, the power supplied from the heater power supply 112 to the heater 111 to control the calorific value of the heater 111.

Next, energy is applied to the wafer W to remove the reaction layer. It is possible to remove the reaction layer by applying energy to the reaction layer by, for example, an electron beam, plasma, heat, or microwaves. For example, as illustrated in (C) of FIG. 3, the reaction layer is removed by heating the wafer W. In the present embodiment, the wafer W is heated to a predetermined temperature higher than 100° C. (e.g., 300° C.). As a result, the following reaction occurs to sublimate $(NH_4)_2SiF_6$. Therefore, the film (e.g., the $SiO_2$ film) is removed (etched) from the wafer W.

$(NH_4)_2SiF_6 \rightarrow SiF_4 + 2NH_3 + 2\ HF$

Here, when the wafer W is heated to, for example, 300° C. by the plasma processing apparatus 100, the temperature of the stage 110 also becomes high, and it takes a long time until an AFS forming processing is enabled on the next wafer W. Accordingly, the wafer W having the AFS formed thereon is transported to the heating apparatus 200, and the wafer W is heated by the heating apparatus 200 to a predetermined temperature higher than 100° C. (e.g., 300° C.). As described above, by separately performing the CR processing using the plasma processing apparatus 100 and the heating apparatus 200, it is possible to reduce a temperature-rising/lowering time during the processing. In the present embodiment, although the case where a substrate processing is performed using the plasma processing apparatus 100 and the heating apparatus 200 has been described as an example, the present disclosure is not limited thereto. For example, the reaction layer may be removed by heating the wafer W using the plasma processing apparatus 100. Thus, it is possible to perform a substrate processing by a single plasma processing chamber 102. In another example, the reaction layer may be formed by plasma using a single plasma apparatus, and the reaction layer may be removed by irradiating the reaction layer with plasma as energy using the same apparatus. In this case, since the processing is capable of being performed in-situ, it is possible to shorten the overall processing time.

A CR processing is capable of removing $SiO_2$ at a higher etching rate than the etching rate of Si or SiN.

Figure 4:
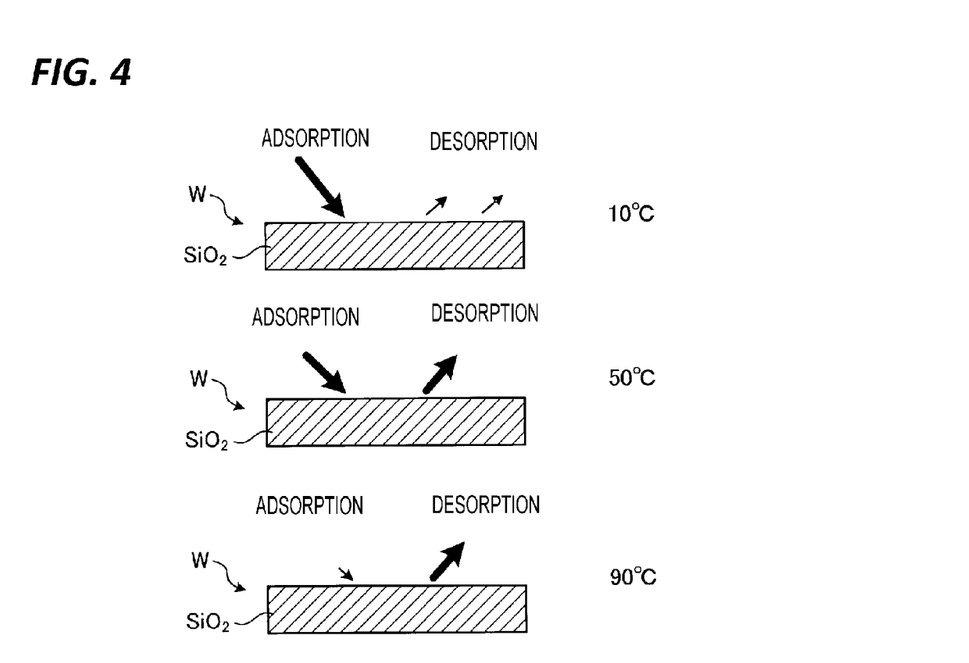
FIG. 4 is a view for describing changes in adsorption amount and desorption amount during reaction layer formation due to a temperature change of a wafer according to an embodiment.

However, in the CR processing, the thickness of the reaction layer to be formed varies depending on the temperature of the wafer W during the formation of the reaction layer. Therefore, the removal amount of the $SiO_2$ film removed by sublimation is changed. FIG. 4 is a view for describing changes in adsorption amount and desorption amount during reaction layer formation due to a temperature change of a wafer according to an embodiment. $NH_4F$ and $NH_4.HF$ adsorb and desorb on the surface of the $SiO_2$ film. The adsorption amount and desorption amount of $NH_4F$ and $NH_4.HF$ vary depending on the temperature of the wafer W. For example, when the temperature of the wafer W is 10° C., the adsorption amount is large, and the desorption amount is small. When the temperature of the wafer W is 50° C., the adsorption amount and the desorption amount are almost equal. When the temperature of the wafer W is 90° C., the adsorption amount is small, and the desorption amount is large.

Figure 5:
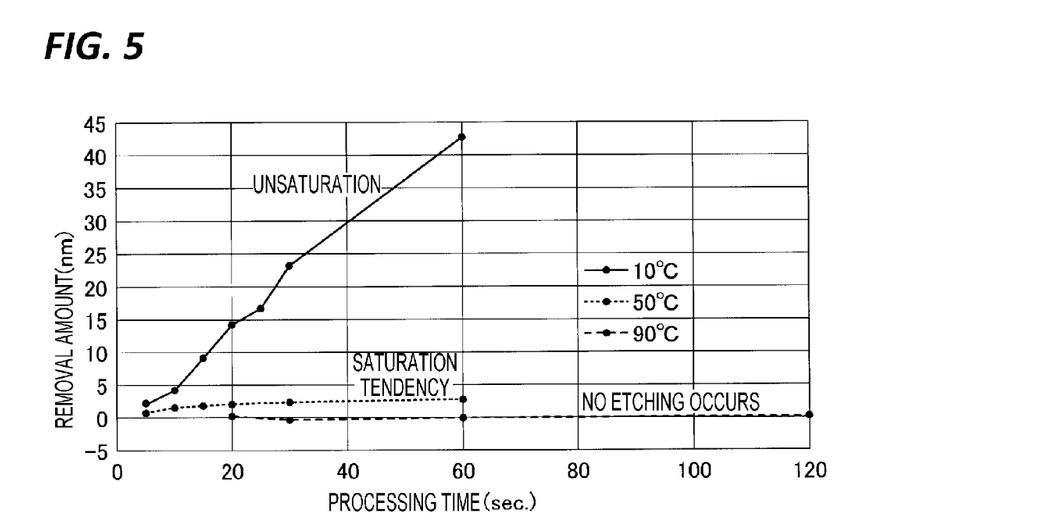
FIG. 5 is a graph representing an exemplary change in a removal amount during sublimation according to a change in the temperature of a wafer during formation of the reaction layer according to an embodiment.

FIG. 5 is a graph representing an exemplary change in a removal amount during sublimation according to a change in the temperature of a wafer during formation of the reaction layer according to an embodiment. FIG. 5 represents changes in the removal amount of an $SiO_2$ film during sublimation with respect to a processing time for forming a reaction layer when the temperature of the wafer W during the formation of the reaction layer is set to 10° C., 50° C., and 90° C. When the temperature of the wafer W during the formation of the reaction layer is set to 10° C., the removal amount of the $SiO_2$ film increases as the processing time for forming the reaction layer becomes longer. Meanwhile, when the temperature of the wafer W during the formation of the reaction layer is set to 90° C., etching hardly occurs, and the removal amount of the $SiO_2$ film transits in the vicinity of zero even if the processing time for forming the reaction layer becomes longer.

Meanwhile, when the temperature of the wafer W during the formation of the reaction layer is set to 50° C., the removal amount of the $SiO_2$ film slightly increases when the processing time for forming the reaction layer is short, but the removal amount is saturated when the processing time becomes longer. In the example of FIG. 5, when the temperature of the wafer W is 50° C., the removal amount is saturated after the processing time of 40 seconds.

In addition, although the case where the temperature of the wafer W during the formation of the reaction layer is set to 10° C., 50° C., and 90° C. has been described as an example, the present disclosure is not limited thereto. In this example, the temperature of the wafer W during the formation of the reaction layer may be 100° C. or lower, and may be 0° C. or lower.

Accordingly, the CR processing may control the removal amount of the $SiO_2$ film by controlling the thickness of the reaction layer formed on the wafer W by controlling the temperature of the wafer W during the formation of the reaction layer. For example, in the CR processing, it is possible to etch the $SiO_2$ film with high accuracy by setting the temperature of the wafer W to about 50° C. In the CR processing, it is possible to increase the removal amount of the $SiO_2$ film by setting the temperature of the wafer W to about 10° C.

For example, the wafer W is provided with a mask formed of a $SiO_2$ film and having a pattern formed therein. By performing the CR processing on the wafer W while controlling the temperature of the wafer W during the formation of the reaction layer, it is possible to control the shape of a pattern with high accuracy.

In the CR processing, when the patterns formed on a wafer W are isolated and dense, even if the same processing is performed, the removal amount of the patterns may change depending on the iso-dense structure of the patterns.

Figure 6:
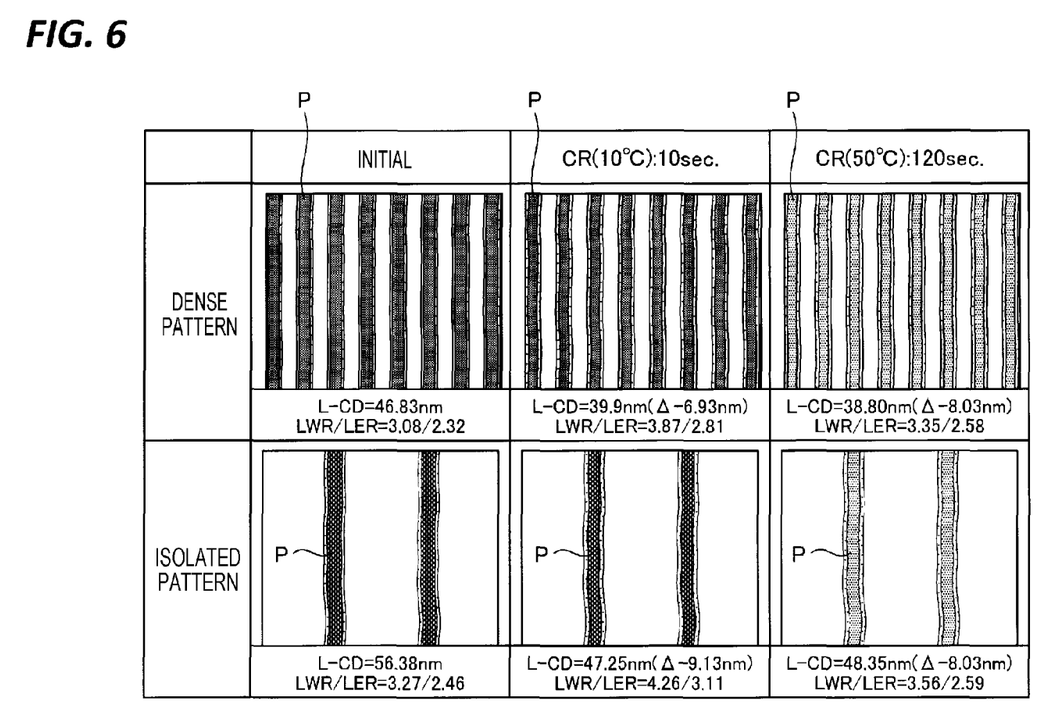
FIG. 6 is a view illustrating exemplary pattern changes in CR processing depending on iso-dense structure of patterns according to an embodiment.

FIG. 6 is a view illustrating exemplary pattern changes in CR processing depending on iso-dense structure of patterns according to an embodiment. In FIG. 6, changes in dense line patterns P and changes in isolated line patterns P are represented side by side. In "Initial" in FIG. 6, initial shapes of line patterns P are represented. In addition, the widths of the line patterns P are indicated in L-CD (critical dimension). In addition, line width roughness (LWR) and line edge roughness (LER) of each line pattern P are represented.

In "CR (10° C.): 10 sec" in FIG. 6, a change in the shape of each pattern in the case where the temperature of the wafer W during the formation of the reaction layer is set to 10° C., and the processing time for forming the reaction layer is set to 10 seconds is represented. In "CR (10° C.): 10 sec," in the dense pattern P, the L-CD is changed by −6.93 nm from the initial shape. Meanwhile, in the isolated pattern P, the L-CD is changed by −9.13 nm from the initial shape. In "CR (10° C.): 10 S," a difference of −2.2 nm occurs in the change of L-CD between the dense pattern P and the isolated pattern P.

In "CR (50□): 120 sec" in FIG. 6, a change in the shape of each pattern in the case where the temperature of the wafer W during the formation of the reaction layer is set to 10° C., and the processing time for forming the reaction layer is set to 120 seconds is represented. In "CR (50□): 120 sec," in the dense pattern P, the L-CD is changed by −8.03 nm from the initial shape. Meanwhile, in the isolated pattern P, the L-CD is changed by −8.03 nm from the initial shape. In "CR (50° C.): 120 sec," there is no difference in the change in L-CD between the dense pattern P and the isolated pattern P.

As described above, the substrate processing according to an embodiment is capable of controlling the width (L-CD) of each of patterns P in isolated and dense regions by controlling the temperature at which the reaction layer is formed.

Figure 7:
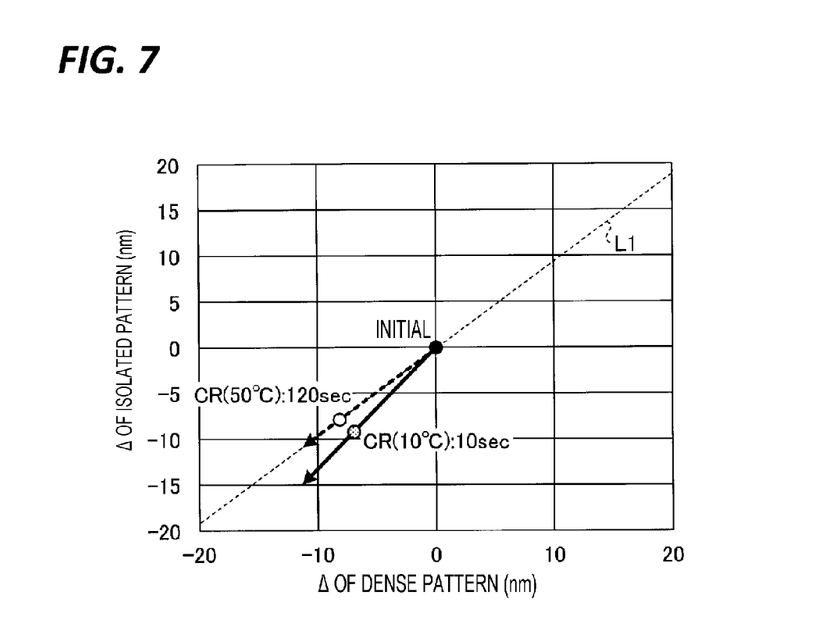
FIG. 7 is a view illustrating exemplary pattern changes in CR processing depending on iso-dense structure of patterns according to an embodiment.

FIG. 7 is a view illustrating exemplary pattern changes in CR processing depending on iso-dense structure of patterns according to an embodiment. FIG. 7 represents a change (Δ) from the initial shape in a dense line pattern P and a change (Δ) from the initial shape in an isolated line pattern P for "CR (10° C.): 10 sec" and "CR (50° C.): 120 sec" in FIG. 6. In "CR (50° C.): 120 sec," since the L-CD of the dense pattern P and the L-CD of the isolated pattern P change in the same manner, the change (Δ) in the L-CD decreases along the broken line L1, which is indicated in a one-to-one direct proportion. Meanwhile, in "CR (10° C.): 10 sec," there is a difference in the change in L-CD between the dense pattern P and the isolated pattern P, and thus, there is a deviation from the broken line L1.

As described, in the CR processing, when the patterns P formed on the $SiO_2$ film 11 of the wafer W are isolated and dense, the etching amount of the patterns P may change depending on the iso-dense structure of the patterns P even if the same processing is performed. For example, in the above-described CR processing in "CR (10° C.): 10 sec," the isolated patterns P is etched more than the dense pattern P, and the change of the L-CD in the isolated patterns P is larger than that in the dense patterns P. In addition, in the CR processing, the removal amount of the patterns P also changes depending on the temperature of the wafer W during the formation of the reaction layer.

In the CR processing, the removal amount of patterns P varies depending on the number of particles and the state of the wafer W. For this reason, in the CR processing, a preprocessing such as heating or plasma processing may be performed in order to remove particles or adjust the state of the wafer W.

Figure 8:
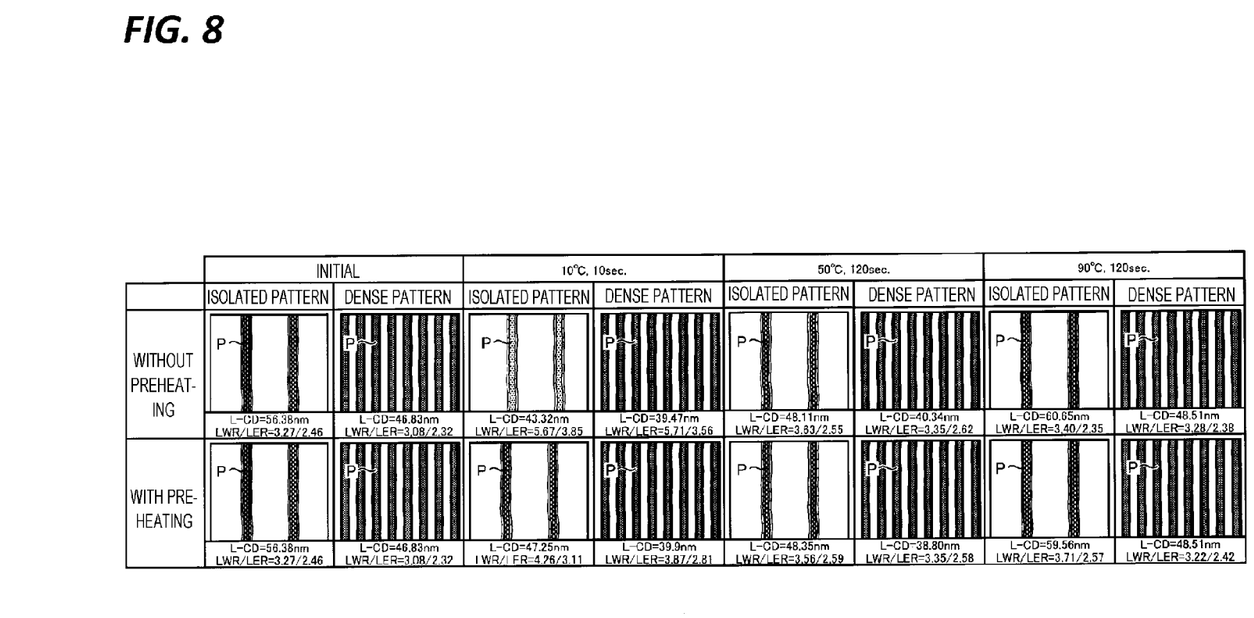
FIG. 8 is a view illustrating exemplary pattern changes in CR processing depending on presence/absence of preheating according to an embodiment.

FIG. 8 is a view illustrating exemplary pattern changes in CR processing depending on presence/absence of preheating according to an embodiment. "Without preheating" in FIG. 8 indicates the case where a CR processing is performed without performing preheating. "With preheating" indicates the case where a CR processing is performed after the preheating for heating the wafer W to 300° C. is performed. In "Initial" in FIG. 8, the initial shapes of a dense line pattern P and an isolated line pattern P are represented. In addition, the width of each line pattern P is represented in L-CD. In addition, LWR and LER of each line pattern P is represented.

In "10° C., 10 sec" in FIG. 8, the shape, L-CD, LWR, and LER of patterns P in the case where the CR processing was performed on the patterns P each having an initial shape in the state in which the temperature of the wafer W during the formation of the reaction layer was set to 10° C. and the processing time for forming the reaction layer was set to 10 seconds. In "50 □, 120 sec" in FIG. 8, the shape, L-CD, LWR, and LER of patterns P in the case where the CR processing was performed on the patterns P each having an initial shape in the state in which the temperature of the wafer W during the formation of the reaction layer was set to 50° C. and the processing time for forming the reaction layer was set to 120 seconds. In "90 □, 120 sec" in FIG. 8, the shape, L-CD, LWR, and LER of each pattern P in the case where the CR processing was performed on patterns P each having an initial shape in the state in which the temperature of the wafer W during the formation of the reaction layer was set to 90° C. and the processing time for forming the reaction layer was set to 120 seconds.

Figure 9:
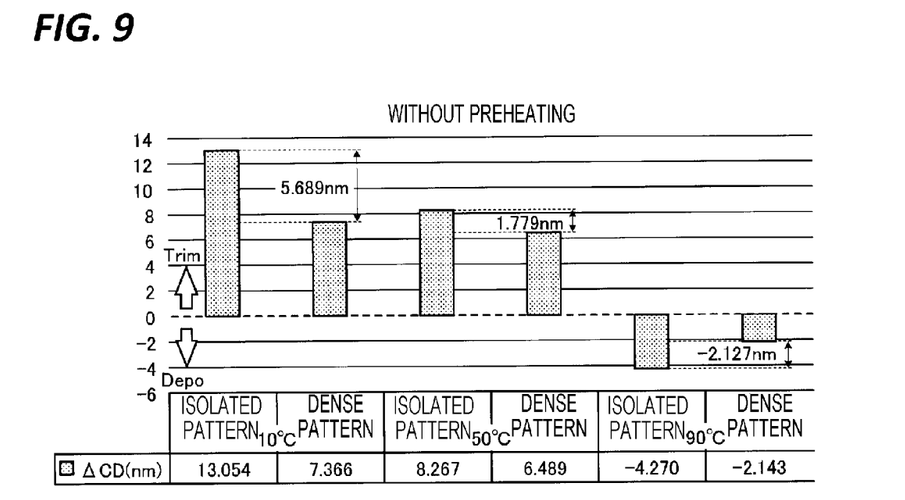
FIG. 9 is a graph illustrating exemplary changes in L-CD in a CR processing without preheating according to an embodiment.

FIG. 9 is a graph illustrating exemplary changes in L-CD in a CR processing without preheating according to an embodiment. Changes in L-CD (ΔCD) from the initial shapes of dense line patterns P and isolated line patterns when the CR processing was performed without performing preheating (in "Without preheating" in FIG. 8) are represented in the lower portion of FIG. 9. In addition, the graph of FIG. 9 represents changes in L-CD of dense patterns P and isolated patterns P and differences between the changes of the dense patterns P and the isolated patterns P. For example, when the temperature of the wafer W during the formation of the reaction layer formation was set to 10° C., the ΔCD of the isolated patterns P was 13.054 nm, the ΔCD of the dense patterns P was 7.366 nm, and the difference in ΔCD was 5.689 nm. In addition, when the temperature of the wafer W during the formation of the reaction layer formation was set to 50° C., the ΔCD of the isolated patterns P was 8.267 nm, the ΔCD of the dense patterns P was 6.489 nm, and the difference in ΔCD was 1.779 nm. In addition, when the temperature of the wafer W during the formation of the reaction layer formation was set to 90° C., the ΔCD of the isolated patterns P was -4.270 nm, the ΔCD of the dense patterns P was -2.143 nm, and the difference in ΔCD was -2.127 nm. Here, when the temperature of the wafer W during the formation of the reaction layer was set to 90° C., ΔCD became a negative value, and the widths of the patterns P were slightly increased.

Figure 10:
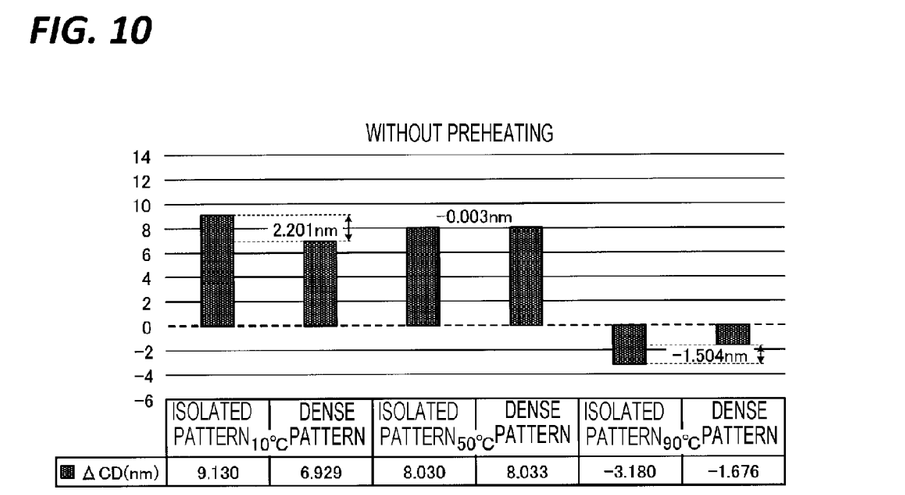
FIG. 10 is a graph illustrating exemplary changes in L-CD in a CR processing in which preheating was performed according to an embodiment.

FIG. 10 is a graph illustrating exemplary changes in L-CD in a CR processing in which preheating was performed according to an embodiment. Changes in L-CD (ΔCD) from the initial shapes of dense line patterns P and isolated line patterns when the CR processing was performed after preheating (in "With preheating" in FIG. 8) are represented in the lower portion of FIG. 10. In addition, the graph of FIG. 10 represents changes in L-CD of dense patterns P and isolated patterns P and differences between the changes of the dense patterns P and the isolated patterns P. For example, when the temperature of the wafer W during the formation of the reaction layer formation was set to 10° C., the ΔCD of the isolated pattern P was 9.130 nm, the ΔCD of the dense patterns P was 6.929 nm, and the difference in ΔCD was 2.201 nm. In addition, when the temperature of the wafer W during the formation of the reaction layer formation was set to 50° C., the ΔCD of the isolated patterns P was 8.030 nm, the ΔCD of the dense patterns P was 8.033 nm, and the difference in ΔCD was -0.003 nm. In addition, when the temperature of the wafer W during the formation of the reaction layer formation was set to 90° C., the ΔCD of the isolated patterns P was -3.180 nm, the ΔCD of the dense pattern P was -1.676 nm, and the difference in ΔCD was -1.504 nm.

As described above, in the CR processing, the change amounts in the L-CD of dense patterns and isolated patterns vary depending on the temperature of the wafer W during the formation of the reaction layer. In addition, in the CR processing, the differences between change amounts in the L-CD of dense patterns and isolated patterns vary depending on the temperature of the wafer W during the formation of the reaction layer. For example, in the CR processing, with the temperature of about 50° C. as a boundary, the change in the L-CD becomes larger in the isolated patterns P than in the dense patterns P as the temperature becomes lower. In addition, in the CR processing, with the temperature of 50° C. as a boundary, the change in the L-CD of the dense patterns P and the change in the L-CD of the isolated patterns P become substantially equal to each other as the temperature increases. Accordingly, in the CR processing, the widths of dense patterns P and isolated patterns P may be controlled by controlling the temperature of the wafer W during the formation of the reaction layer.

In addition, in the CR processing, when preheating is performed, the difference in ΔCD between dense patterns P and isolated patterns P becomes small. However, by performing preheating, ΔCD is stabilized and an error for each CR processing is reduced, so that it is possible to change the patterns P with high accuracy.

As described above, the CR processing is capable of controlling the removal amount of a pattern P by controlling the temperature of the wafer W when forming the reaction layer. In addition, in the CR processing, the widths of dense patterns P and isolated patterns P may be controlled by controlling the temperature of the wafer W during the formation of the reaction layer. Thus, in the substrate processing according to the present embodiment, it is possible to control the shapes of patterns with high accuracy by setting the temperature of the wafer W such that the change of the patterns P becomes a predetermined change amount and performing the CR processing.

In the present embodiment, the case where patterns P are formed in a line shape has been described as an example, but the present disclosure is not limited thereto. The patterns P may have any shape. For example, a pattern P may be formed in a rectangular shape or may be formed in an oval shape. Even in such patterns P, the removal amount of the patterns P in the CR processing changes depending on the iso-dense structure with an adjacent pattern P.

In the substrate processing according to the present embodiment, the step of setting the temperature of the wafer W, the step of forming the reaction layer, and the step of removing the reaction layer may be sequentially repeated a plurality of cycles. That is, in the substrate processing, the CR processing may be repeated a plurality of cycles. For example, in the substrate processing, the CR processing is repeated by setting the temperature of the wafer W such that the removal amount is reduced. Thus, even when it is impossible to control the shape of the pattern P to a desired formation by one CR processing, it is possible to control the shape of the pattern P to a desired formation with high accuracy by performing the CR processing a plurality of times. In addition, for example, in the substrate processing, the shape of the pattern P may be greatly changed by setting the temperature of the wafer W so as to increase the removal amount and repeating the CR processing. In the substrate processing, when the CR processing is performed a plurality of cycles, the temperature setting of the wafer W may be changed in some of the plurality of cycles. For example, first, the temperature of the wafer W is set such that the removal amount is increased, and the pattern P is greatly etched. Next, the temperature of the wafer W may be set such that the removal amount is decreased, and etching may be performed so as to adjust the pattern P to a target shape. This makes it possible to control the shape of the pattern P to a desired formation with high accuracy with a small number of cycles.

In the substrate processing according to the present embodiment, the case where a silicon-containing film such as, for example, $SiO_2$, is formed on the wafer W as a mask has been described as an example, but the present disclosure is not limited thereto. The mask may be a hard mask of, for example, a SiN film without being limited to the $SiO_2$ film. For example, the wafer W may be provided with a silicon-containing film such as, for example, a SiN film, as a mask, and a pattern P may be formed on the silicon-containing film.

As described above, since the substrate processing according to the present embodiment is capable of controlling the shape of the pattern P with high accuracy, it is possible to control the shape of the film to be etched with high accuracy by performing etching using the pattern P as a mask.

Figure 11:
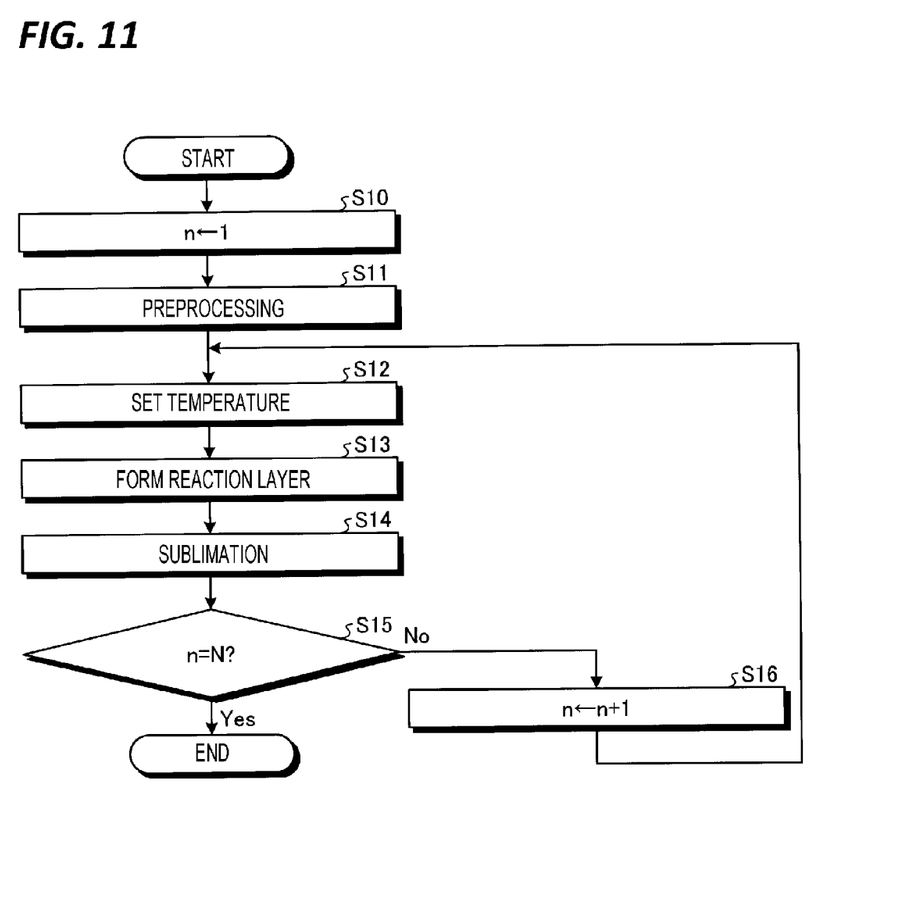
FIG. 11 is a flowchart illustrating an exemplary flow of a substrate processing according to an embodiment.

Next, a flow of the substrate processing according to the present embodiment will be briefly described. FIG. 11 is a flowchart illustrating an exemplary flow of a substrate processing according to an embodiment. When performing a substrate processing, a wafer W is transported by a transport mechanism and provided to the heating apparatus 200 and the plasma processing apparatus 100.

First, a counter n is initialized to 1 (step S10).

Next, in order to adjust the state of the wafer W, a preprocessing such as, for example, heating, plasma processing, or inhibitor adsorption is performed (step S11). For example, the plasma processing apparatus 100 supplies power from the heater power supply 112 to the heater 111 so as to preheat the wafer W.

Next, the temperature of the wafer W is set such that the change of the pattern P becomes a predetermined change amount (step S12). For example, the plasma processing apparatus 100 controls the temperature of the wafer W to a predetermined temperature of 100° C. or lower depending on the control mode of the shape of the pattern P by controlling the power supplied from the heater power supply 112 to the heater 111 so as to control the calorific value of the heater 111. For example, when the temperature of the wafer W is about 50° C., the removal amount of the $SiO_2$ film is decreased compared to that in the case where the temperature of the wafer W is lower than 50° C. (e.g., 10° C.). When it is desired to etch the $SiO_2$ film little by little, the temperature of the wafer W is controlled to about 50° C. For example, when the patterns P formed on the wafer W are isolated and dense, a difference in the change of L-CD ($\Delta$CD) between the isolated and dense patterns P in the case where the temperature of the wafer W is about 50° C. is decreased compared with that in the case where the temperature of the wafer W is lower than 50° C. (e.g., 10° C.). When it is desired to control the L-CD of the dense patterns P with high accuracy, the temperature of the wafer W is controlled to about 50° C. In addition, the temperature of the wafer W may be changed for each cycle.

Next, a reaction layer is formed on the surface layer of the wafer W (step S13). For example, the plasma processing apparatus 100 introduces various gases such as, for example, $NF_3$ gas, $NH_3$ gas, and Ar gas used for a CR processing from the gas supply 120, and generates plasma. Thus, an AFS layer is formed on the wafer W.

Next, the wafer W is heated to sublimate the reaction layer (AFS) to remove the reaction layer (step S14). For example, the wafer W is transported to the heating apparatus 200, and the wafer W is heated by the heating apparatus 200 to a predetermined temperature higher than 100° C. (e.g., 300° C.). Thus, the reaction layer is removed from the wafer W.

It is determined whether or not the value of the counter n becomes a predetermined number of cycles N (step S15). The number of cycles N is determined according to the number of times of performing etching by the CR processing.

When the value of the counter n does not become the number of cycles N (step S15: No), the value of the counter n is counted up by one (step S16), and the flow proceeds to step S12 described above.

Meanwhile, when the value of the counter n becomes the number of cycles N (step S15: Yes), the processing is terminated.

In addition, the substrate processing may further include an etching processing for etching the wafer (W). The etching processing is performed after controlling the shape of the pattern P to a desired state. For example, when the value of the counter n becomes the number of cycles N (step S15: Yes), the processing is terminated.

Figure 12A:
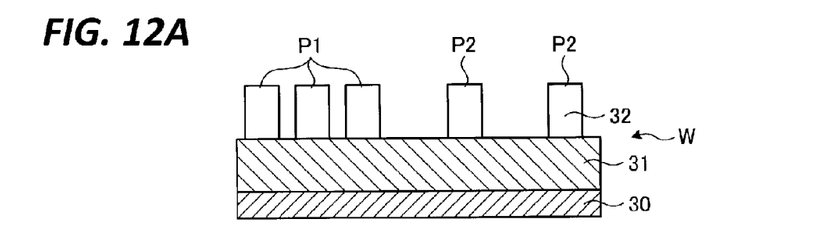
FIGS. 12A to 12D are views illustrating an exemplary substrate processing according to an embodiment.

An exemplary substrate processing including an etching processing will be described. FIGS. 12A to 12D are views illustrating an exemplary substrate processing according to an embodiment. As illustrated in FIG. 12A, a wafer W has a silicon (Si) layer 30 serving as a base, and a SiN layer 31 formed on the Si layer 30 as an etching-target film. Patterns formed of a Si-containing film 32 (e.g., a $SiO_2$ film) is formed on the SiN layer 31. Here, the patterns include dense patterns P1 and isolated patterns P2. In an example, the patterns P1 and the patterns P2 are formed in the same width. The temperature of the wafer W is set such that each of the change in the patterns P1 and the change in the patters P2 becomes a predetermine change amount (step S12). For example, when making the removal amount of the patterns P2 larger than the removal amount of the patterns P1, the temperature of the wafer W is set to be low (e.g., 10° C.). Meanwhile, the removal amounts in the iso-dense patterns may be made to be substantially the same by setting the temperature of the wafer W to be higher than 10° C. (e.g., about 50° C.).

Figure 12B:
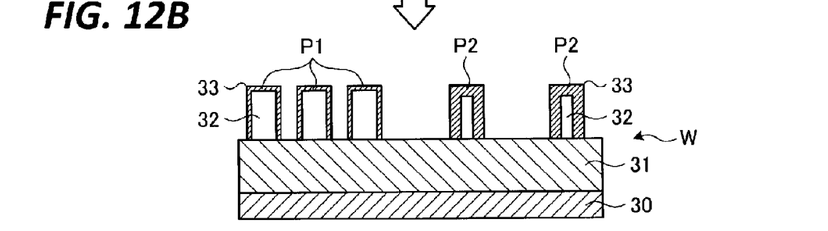

Various gases such as, for example, $NF_3$ gas, $NH_3$ gas, and Ar gas are introduced, plasma is generated, and a reaction layer is formed on the wafer W. FIG. 12B illustrate state where the reaction layer 33 is formed. On the patterns P1 and P2, a reaction layer 33 is formed.

Figure 12C:
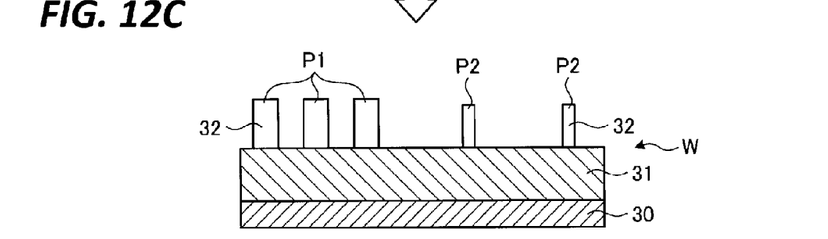

Then, the reaction layer 33 is removed by applying energy to the wafer W (e.g., heating). FIG. 12C represents the state where the reaction layer 33 is removed. When the temperature of the wafer W during the formation of the reaction layer 33 is set to 10° C., the removal amount of the isolated patterns P2 becomes larger than the removal amount of the dense patterns P1. For this reason, the width of the patterns P2 is narrower than the width of the patterns P1. In this way, in the substrate processing according to the embodiment, it is possible to individually control the width (CD) of the dense patterns P1 and the width CD of the isolated patterns P2 by controlling the temperature of the wafer W during the formation of the reaction layer 33. In the substrate processing, it is possible to control the shapes of the patterns P1 and P2 with high accuracy, for example, by controlling the temperature of the wafer W during the formation of the reaction layer 33 such that the removal amounts thereof are decreased.

Figure 12D:
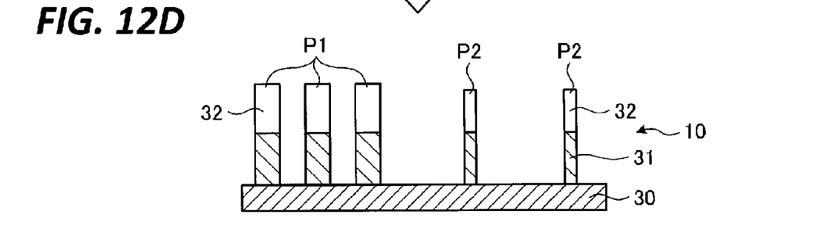

The SiN layer 31 of the wafer W is etched using the Si-containing film 32 as a mask. FIG. 12D represents the state where the SiN layer 31 is etched. The SiN layer 31 is etched along the patterns P1 and P2. Since the substrate processing according to the embodiment is capable of controlling the shapes of the patterns P1 and P2 with high accuracy, it is possible to control the shape of the etched SiN layer 31 with high accuracy.

As described above, in the substrate processing according to the present embodiment, a substrate (wafer W) having a pattern P formed on the surface layer thereof is provided. Next, in the substrate processing, the temperature of the substrate is set such that a change in the pattern P becomes a predetermined change amount. Next, in the substrate processing, a reaction layer having a thickness according to a temperature is formed on the surface layer of the substrate. Next, in the substrate processing, the reaction layer is removed by applying energy to the substrate. Thus, the substrate processing according to the present embodiment is capable of controlling the shape of the pattern P with high accuracy.

In the substrate processing, temperature setting of the substrate, formation of the reaction layer, and removal of the reaction layer are sequentially repeated a plurality of cycles. Thus, the substrate processing according to the present embodiment is capable of controlling the shape of the pattern P to a desired shape.

In the substrate processing, the temperature setting of the substrate is changed in some of the plurality of cycles. Thus, the substrate processing according to the present embodiment may change the removal amount in some cycles when etching is performed a plurality of cycles.

In addition, the substrate has iso-dense patterns P formed thereon. In the substrate processing, the pattern widths of the dense patterns P and the isolated patterns P are controlled by controlling the temperature setting of the substrate. Thus, the substrate processing according to the present embodiment is capable of controlling the shapes of the dense patterns P and the isolated patterns P with high accuracy.

The substrate has patterns P formed on a Si-containing film. In the substrate processing, the temperature of the substrate is set to a temperature at which a change in the pattern at 100° C. or lower becomes the predetermined change amount, $(NH_4)_2SiF_6$ is formed as a reaction layer on the surface layer of the substrate, and the reaction layer is removed by heating the substrate to a temperature higher than 100° C. Thus, the substrate processing according to the present embodiment is capable of controlling the shapes of the patterns P formed in the Si-containing film with high accuracy.

For example, in the embodiments, although the case where a substrate to be processed is a semiconductor wafer has been described as an example, the present disclosure is not limited thereto. The substrate to be processed may be another substrate such as, for example, a glass substrate.

Figure 13:
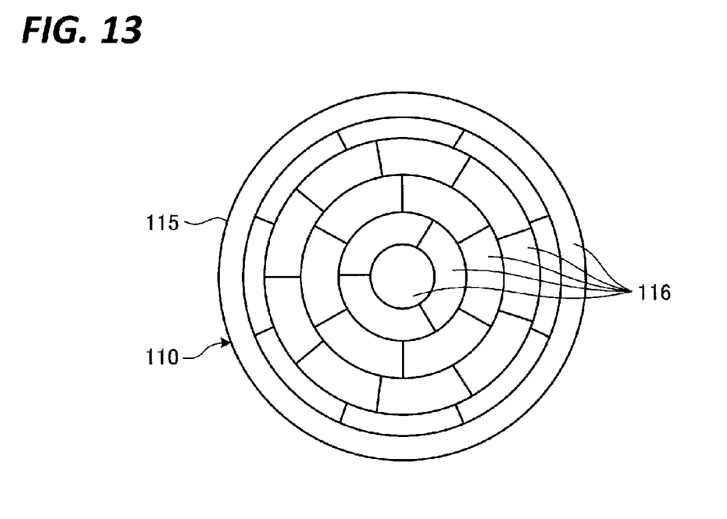
FIG. 13 is a view illustrating exemplary zone division of the placement surface of a stage according to an embodiment.

In the plasma processing apparatus 100 according to the embodiments described above, the case where the temperature of a wafer W is controlled by providing one heater 111 on the entire placement surface of the stage 110 on which the wafer W is placed has been described as an example, but the present disclosure is not limited thereto. The placement surface of the stage 110 may be divided into a plurality of zones, and a heater 111 may be provided in each zone so as to control the temperature of a wafer W for each zone. The placement surface of the stage 110 may be divided concentrically and further divided circumferentially. FIG. 13 is a view illustrating exemplary zone division of the placement surface of a stage according to an embodiment. FIG. 13 illustrates the placement surface 115 of the stage 110. A wafer W is placed on the placement surface 115. The placement surface 115 is divided into a plurality of zones 116. In the example of FIG. 13, the placement surface 115 is divided concentrically and further divided in the circumferential direction. Thus, by dividing the placement surface 115 into the plurality of zones 116 and controlling the temperature of the wafer W for each zone 116, it is possible to control the shapes of patterns P for respective zones of the wafer W corresponding to respective zones 116.

In addition, in the embodiments, although the case where an ICP type plasma processing apparatus is used as the plasma processing apparatus 100 has been described as an example, the present disclosure is not limited thereto. The plasma processing apparatus 100 may be any type of plasma processing apparatus. For example, the plasma processing apparatus 100 may be a capacitively coupled parallel plate plasma processing apparatus. In addition, the plasma processing apparatus 100 may be, for example, a remote source type plasma processing apparatus in which microwave plasma, magnetron plasma, or plasma generated using a remote source is supplied to the processing chamber 102 through, for example, a pipe.

In the embodiments, although the case where a wafer W is heated by the heater has been described as an example, the present disclosure is not limited thereto. For example, any heating method may be used as long as the wafer W can be heated. For example, the wafer W may be heated by, for example, plasma, an infrared lamp, or electron beam irradiation.

In the present embodiment, although the case where a substrate processing is performed using the plasma processing apparatus 100 and the heating apparatus 200 has been described as an example, the present disclosure is not limited thereto. The substrate processing according to the embodiments may be implemented by combining apparatuses other than the plasma processing apparatus 100 and the heating apparatus 200.

According to the present disclosure, it is possible to control the shape of the pattern with high accuracy.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
providing a substrate having a pattern formed on a surface layer thereof;
heating the substrate to a first temperature;
changing the first temperature of the substrate to a second temperature lower than the first temperature such that a change in the pattern of the substrate becomes a predetermined change amount, based on data reflecting a correlation of the predetermined change amount and temperature at which a reaction layer is formed, and wherein the second temperature is equal to or lower than 100° C.;
forming by plasma the reaction layer containing $(NH_4)_2SiF_6$ and having a thickness corresponding to the second temperature on the surface layer of the substrate; and
applying energy to the substrate formed with the reaction layer thereby removing the reaction layer from the surface layer of the substrate to obtain the predetermined change amount,
wherein the forming of the reaction layer includes exposing the substrate to at least one of: (a) both $NF_3$ and $NH_3$, or (b) $NH_xF_y$.

2. The substrate processing method according to claim 1, wherein the changing step, the forming the reaction layer, and the applying the energy are sequentially repeated in a plurality of cycles.

3. The substrate processing method according to claim 2, wherein a temperature setting of the substrate is changed in a portion of the plurality of cycles.

4. The substrate processing method according to claim 3, wherein the substrate has an iso-dense pattern formed thereon, and
in the changing step, a pattern width of the iso-dense pattern is controlled by controlling temperature setting of the substrate.

5. The substrate processing method according to claim 4, wherein the substrate includes a Si-containing film having a pattern formed thereon,
in the changing step, the temperature of the substrate is set to a temperature at which a change in the pattern at 100° C. or lower becomes the predetermined change amount, and
the reaction layer is removed by heating the substrate to a temperature higher than 100° C.

6. The substrate processing method according to claim 1, wherein the substrate has an iso-dense pattern formed thereon, and
in the changing step, a pattern width of the iso-dense pattern is controlled by controlling temperature setting of the substrate.

7. The substrate processing method according to claim 1, wherein the substrate includes a Si-containing film having a pattern formed thereon,
in the changing step, the temperature of the substrate is set to a temperature at which a change in the pattern at 100° C. or lower becomes the predetermined change amount, and
the reaction layer is removed by heating the substrate to a temperature higher than 100° C.

8. The substrate processing method according to claim 1, wherein:
the substrate includes a mask to provide the pattern, and the reaction layer is formed on the mask,
the forming of the reaction layer and removing of the reaction layer reduces at least one dimension of the mask while retaining portions of the mask having the at least one reduced dimension;
the mask is above an etching target layer, and the method further includes etching the etching target layer through the portions of the mask having the at least one reduced dimension.

9. The substrate processing method according to claim 8, including using $NF_3$ and $NH_3$ to generate $NH_xF_y$, and exposing the mask to the $NH_xF_y$ to form the reaction layer.

10. The substrate processing method of claim 9, wherein the reaction layer is formed at below 100° C.

11. The substrate processing method according to claim 1, including using $NF_3$ and $NH_3$ to generate $NH_xF_y$, and exposing the substrate to the $NH_xF_y$ to form the reaction layer.

* * * * *